United States Patent
Hayami et al.

(10) Patent No.: US 6,819,724 B2
(45) Date of Patent: Nov. 16, 2004

(54) VITERBI DECODER AND VITERBI DECODING METHOD

(75) Inventors: Atsushi Hayami, Kanagawa-ken (JP); Tsuyoshi Oki, Kanagawa-ken (JP)

(73) Assignee: Victor Company of Japan, Limited, Yokohama (JP)

( * ) Notice: Subject to any disclaimer, the term of this patent is extended or adjusted under 35 U.S.C. 154(b) by 724 days.

(21) Appl. No.: 09/737,597

(22) Filed: Dec. 18, 2000

(65) Prior Publication Data

US 2002/0013927 A1 Jan. 31, 2002

(30) Foreign Application Priority Data

Dec. 24, 1999 (JP) .......................................... P11-367347

(51) Int. Cl.[7] .............................. H04D 1/00; G11B 5/09
(52) U.S. Cl. .................................... 375/341; 369/59.22
(58) Field of Search ......................... 375/341; 714/795, 714/794; 369/59.22

(56) References Cited

U.S. PATENT DOCUMENTS

| 5,566,155 A | * | 10/1996 | Hayashi | .................. | 369/59.22 |
| 5,684,773 A | * | 11/1997 | Hayashi | .................. | 369/47.35 |
| 5,938,788 A | * | 8/1999 | Hayashi | ..................... | 714/794 |
| 5,982,822 A | * | 11/1999 | Hatakeyama | ............... | 375/341 |
| 5,995,465 A | * | 11/1999 | Hayashi et al. | .......... | 369/47.28 |
| 6,005,729 A | * | 12/1999 | Poss | ........................... | 360/51 |
| 6,240,145 B1 | * | 5/2001 | Koizumi | ...................... | 375/341 |
| 6,477,125 B1 | * | 11/2002 | Hayami | .................. | 369/59.22 |

FOREIGN PATENT DOCUMENTS

| JP | 06-150549 | 5/1994 |
| JP | 07-093916 | 4/1995 |
| JP | 08-031101 | 2/1996 |
| JP | 11-203795 | 7/1999 |

OTHER PUBLICATIONS

Qureshi, S., "Adaptive Equalization" *Proceedings of the IEEE*, vol. 73, No. 9, pp. 1349–1387 (Sep. 1985).

* cited by examiner

*Primary Examiner*—Stephen Chin
*Assistant Examiner*—Cicely Q Ware
(74) *Attorney, Agent, or Firm*—Nath & Associates PLLC; Marvin C. Berkowitz; Jarrod N. Raphael

(57) ABSTRACT

A data estimating circuit outputs estimation data which estimates input data at a time earlier by a predetermined bit cycle than the input data based on decoded data series outputted from a path memory. A target value computing circuit corrects the target value with a difference between the estimation data and input data as a target value error and outputs obtained plural first target values to a branchmetric operating circuit as plural target values. Because the branchmetric operating circuit can conduct branchmetric operation based on plural first target values near plural averages having the highest incidence (having peaks in histogram), decoding performance can be improved more as compared to using fixed target values.

4 Claims, 8 Drawing Sheets

FIG.11

VITERBI DECODER AND VITERBI DECODING METHOD

CROSS REFERENCE TO RELATED APPLICATION

This application claims benefit of priority under 35 U.S.C §119 to Japanese Patent Application No. Hei11-367347, filed on Dec. 24, 1999, the entire contents of which are incorporated by reference herein.

BACKGROUND OF THE INVENTION

1. Field of the Invention

The present invention relates to Viterbi decoder and Viterbi decoding method and more particularly to a Viterbi decoder and Viterbi decoding method for decoding recorded data from such a digital recording medium as optical disc and magneto-optic disc.

2. Description of the Related Art

In a reproducing apparatus for such a digital recording medium as optical disc and magneto-optic disc, asymmetry occurs in reproduced signal due to length or depth of a recording pit. Thus, conventionally, there has been often used an apparatus (auto slicer) for controlling a slicing level of a detecting circuit for detecting a digital signal by slicing the reproduced signal according to a predetermined threshold, based on the asymmetry of the reproduced signal. Further, Japanese Patent Application Laid-Open No. H6-150549 has disclosed "optical information reproducing apparatus" in which to make the Viterbi decoder correspond to the asymmetry of the reproduced signal, asymmetrical rate of pit information is detected, correction pit information is generated based on this asymmetry rate and this correction pit information is decoded by the Viterbi decoder.

However, according to the aforementioned Japanese Patent Application Laid-Open No. H6-150549, changes of characteristics in a recording area cannot be followed unless any other ways than correcting of an area in which known pits are recorded are employed. Specifically, it is estimated that this invention cannot be applied to a rewritable medium.

Figure 1:
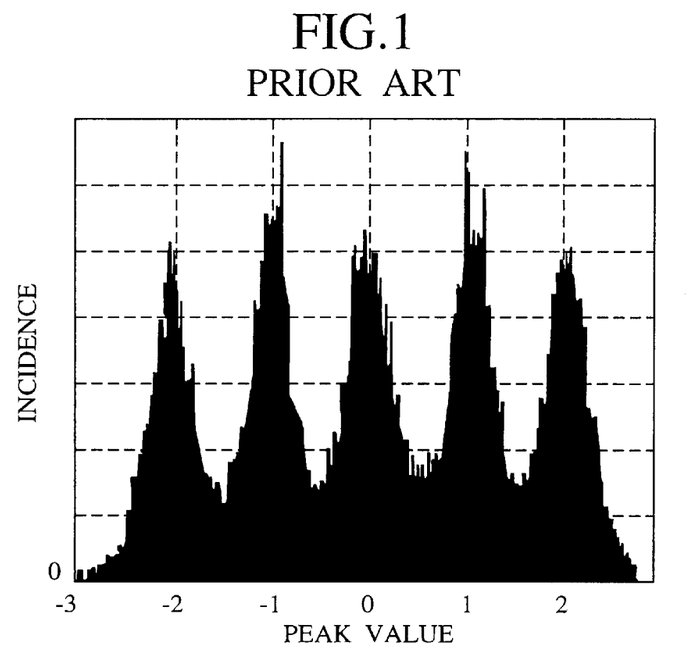
FIG. 1 is a histogram of symmetrical reproduced waves.

FIG. 1 shows a result of sampling excellently symmetrical reproduced signals at bit cycle T, namely, measuring a histogram of signal values at an input position to a Viterbi decoder, for a level (signal value) of the reproduced waveform to be, for example, substantially −2, −1, 0, 1, 2 by equalizing the waveform of, for example, solitary wave having 1T (T is bit length) width, so that a response waveform has a value of substantially 1, 1, 1, 1, namely, a so-called transmission characteristic has partial response (hereinafter referred to as) PR (1, 1, 1, 1).

Figure 2:
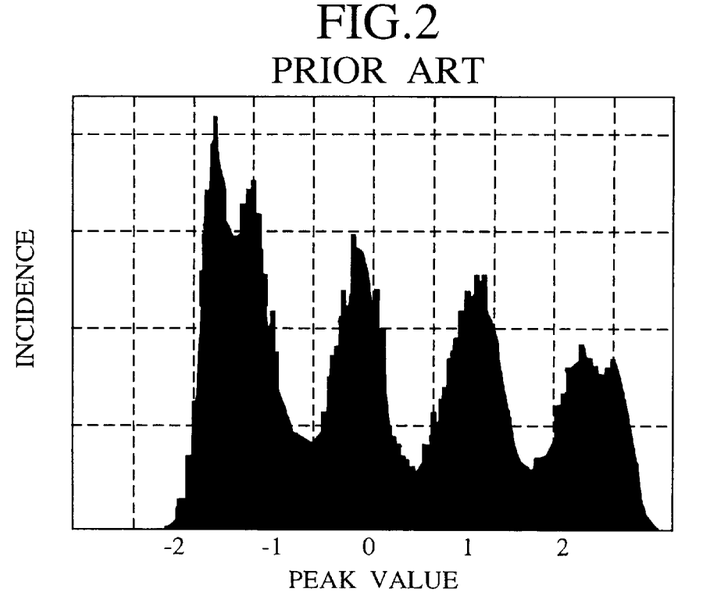
FIG. 2 is a histogram of asymmetrical reproduced waves.

However, depending on excessive or low power at the time of recording and/or characteristic changes of a medium, non-linear distortion occurs so that waveform equalization to PR (1, 1, 1, 1) is very difficult. Consequently, nothing but a reproduced waveform having inferior symmetry as shown in FIG. 2 can be obtained. In the example of FIG. 2, although a waveform equalizer is actuated so as to converge waveform to level of −2, −1, 0, 1, 2, samples which should be converged to level 2 disperse largely. A conventional Viterbi decoder cannot conduct excellent decoding operation for an input wave having such a large non-linear distortion.

SUMMARY OF THE INVENTION

The present invention has been achieved in views of the above described problem, and therefore, an object of the invention is to provide a Viterbi decoder and Viterbi decoding method capable of maintaining excellent reproduction performance even if unevenness in recording mark shape due to recording power or medium characteristic or non-linear distortion in reproduced waveform due to reproduction characteristic occurs when reproducing data recorded in a recording medium.

To achieve the above described object, there is provided a Viterbi decoder comprising: a branchmetric operating circuit for conducting branchmetric operation for input data using plural target values so as to generate a selection signal; a path memory for outputting decoded data series produced by Viterbi-decoding the input data based on the selection signal outputted from the branchmetric operating circuit; a data estimating circuit for outputting estimation data estimating an input data at a time earlier by a predetermined bit cycle than the input data based on the decoded data series outputted from the path memory; and a target value computing means for correcting the target values with a difference between the estimation data outputted from the data estimating circuit and the input data, as a target value error, and outputting obtained plural first target values to the branchmetric operating circuit as the plural target values.

According to the present invention, plural target values used in the branchmetric operating circuit are not fixed values but first target values corrected depending on a target value error which is a difference between the estimation data obtained by the data estimating circuit and the target value computing means and input data. Therefore, the branchmetric operation can be conducted based on the plural first target values near plural averages having the highest incidence (having peaks in histogram).

According to a preferred embodiment of the present invention, the target value computing means holds plural initial target values preliminarily and when operation starts or error operation (control loop) is not converged yet, outputs the plural initial target values to the branchmetric operating circuit as the plural target values.

According to the present invention, the branchmetric operation can be conducted based on plural initial target values when operation starts or error operation (control loop) is not converged yet.

According to another preferred embodiment of the present invention, the target value computing means comprises: a target value computing circuit for generating the plural first target values with a difference between the estimation data outputted from the data estimating circuit and the input data as a target value error; a target value correcting circuit for generating plural second target values as corrected target values corresponding respectively to the plural first target values so that respective target values are symmetrical with respect to a target value which is a median of the plural first target values; and a selecting means for if the target value error obtained by the target value computing circuit is equal to or less than a predetermined threshold, outputting the plural first target values to the branchmetric operation circuit and if the target value error exceeds the threshold, outputting the plural second target values to the branchmetric operating circuit.

According to the present invention, if the equalization waveform (input data) to be inputted to the Viterbi decoder is distorted largely, the target value error exceeds the threshold largely. Thus, the plural second target values are outputted to the branchmetric operating circuit so as to conduct branchmetric operation. The second target values are corrected target values corresponding to the plural first target values so that respective target values are symmetrical with respect to a target value which is a median of the plural first target values.

Further, to achieve the above described object, there is provided a Viterbi decoding method comprising: first step of generating a selection signal by conducting branchmetric operation using plural target values for input data; second step of outputting decoded data series produced by Viterbi-decoding the input data based on the selection signal; third step of outputting estimation data estimating input data at a time earlier by a predetermined bit cycle than the input data based on the decoded data series; and fourth step of correcting the target values with a difference between the estimation data and the input data, as a target value error, and using obtained plural corrected target values as the plural target values.

According to the present invention, the plural target values used for the branchmetric operation are not fixed values, but target values corrected in the fourth step depending on a target value error which is a difference between the estimation data obtained in the third step and the input data. Therefore, the branchmetric operation can be conducted based on plural target values near plural averages having the highest incidence (having peaks in histogram).

The nature, principle and utility of the invention will become more apparent from the following detailed description when read in conjunction with the accompanying drawings.

DESCRIPTION OF THE PREFERRED EMBODIMENTS

Hereinafter, the preferred embodiments of the present invention will be described in detail with reference to the accompanying drawings.

Figure 3:
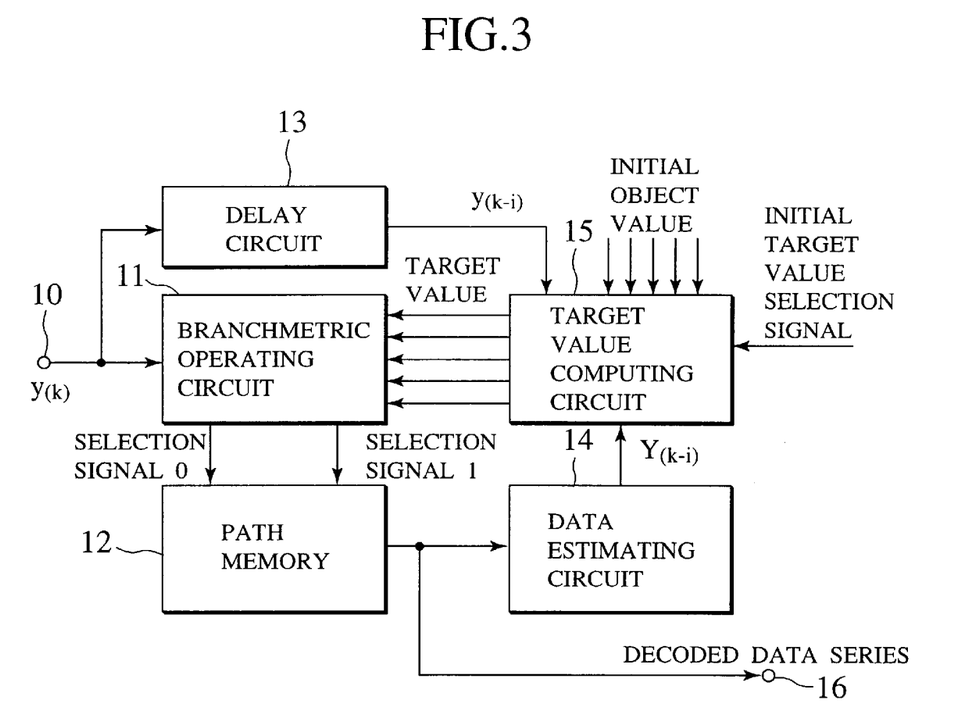
FIG. 3 is a block diagram according to an embodiment of the present invention.

FIG. 3 is a block diagram according to an embodiment of the Viterbi decoder of the present invention. As shown in the same diagram, this embodiment is comprised of: a branchmetric operating circuit 11 to which input data $y_{(k)}$ is supplied through an input terminal 10; a path memory 12 for outputting decoded data series; a delay circuit 13 which waits for a delay time determined depending on the length of the path memory 12; a data estimating circuit 14 for outputting estimated data $Y_{(k-i)}$; and a target value computing circuit 15 for supplying target values to the branchmetric operating circuit 11. A feature of this embodiment is that the conventional Viterbi decoding circuit comprised of the branchmetric operating circuit 11 and the path memory 12 is provided with the delay circuit 13, the data estimating circuit 14 and the target value computing circuit 15.

This embodiment will be described by exemplifying a case where it is applied to transmission line equalization so that transmission characteristic is substantially PR (1, 1, 1, 1) in a reproducing apparatus for a recording medium in which a digital signal is recorded and minimum recording inversion interval thereof is limited to 3T. As the recording medium in which the minimum recording inversion interval is limited to 3T, there are compact disc (CD), digital versatile disc (DVD) and the like. Although this embodiment will be described about the case where the minimum recording inversion interval is limited to 3T, the present invention can be applied to other recording modulation and transmission line equalization methods.

Figure 4:
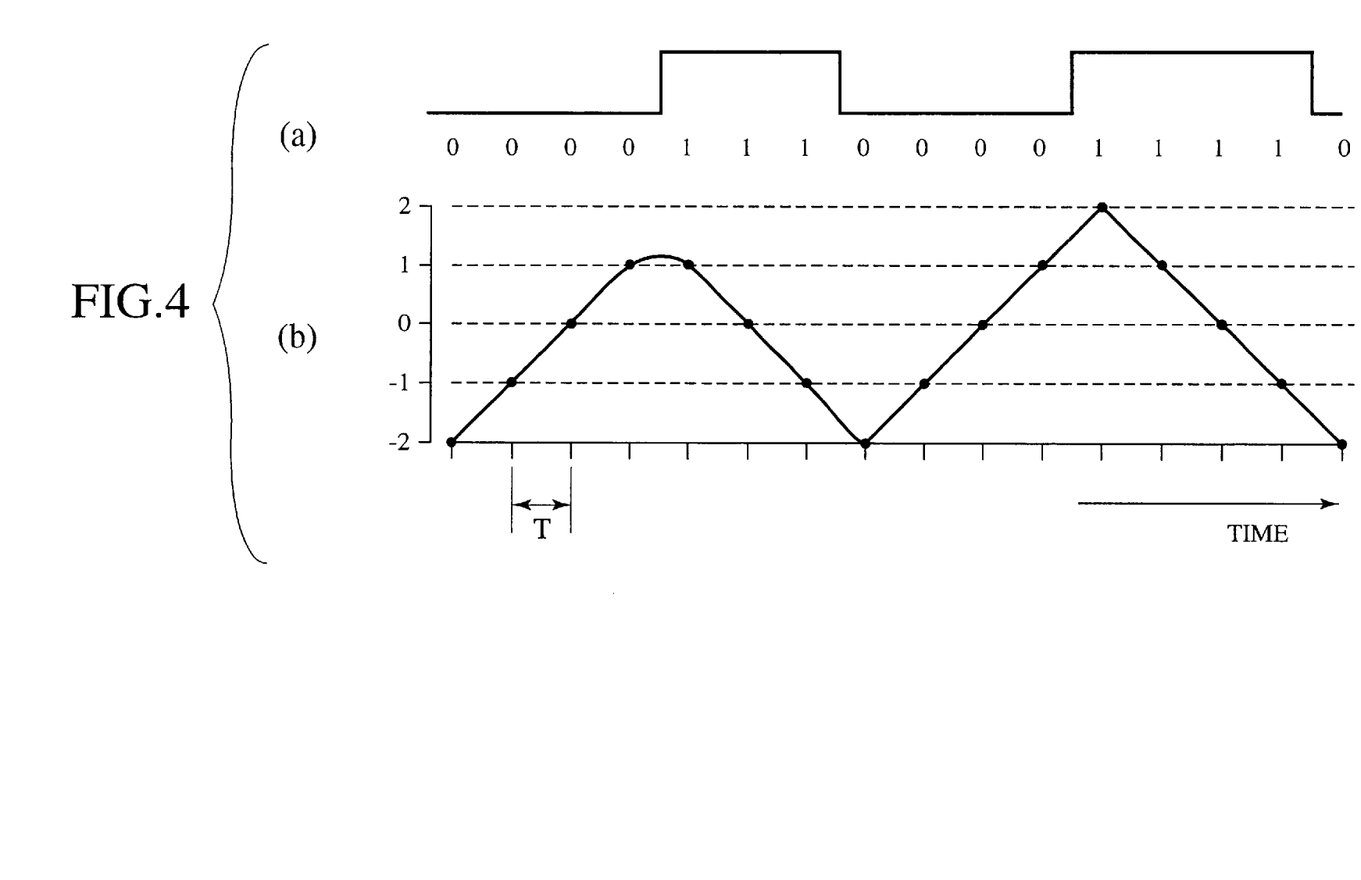
FIG. 4 is an explanatory diagram of PR (1, 1, 1, 1)

FIG. 4($a$) shows recording waves in case where waveform equalization is conducted on solitary wave having width of 1T so as to have a value of substantially 1, 1, 1, 1, that is, the so-called PR (1, 1, 1, 1). FIG. 4($b$) shows reproduced waveform. According to this embodiment, as shown in FIG. 4($b$), the reproduced waveform is equalized so that its level (signal value) is substantially −2, −1, 0, 1, 2.

Figure 5:
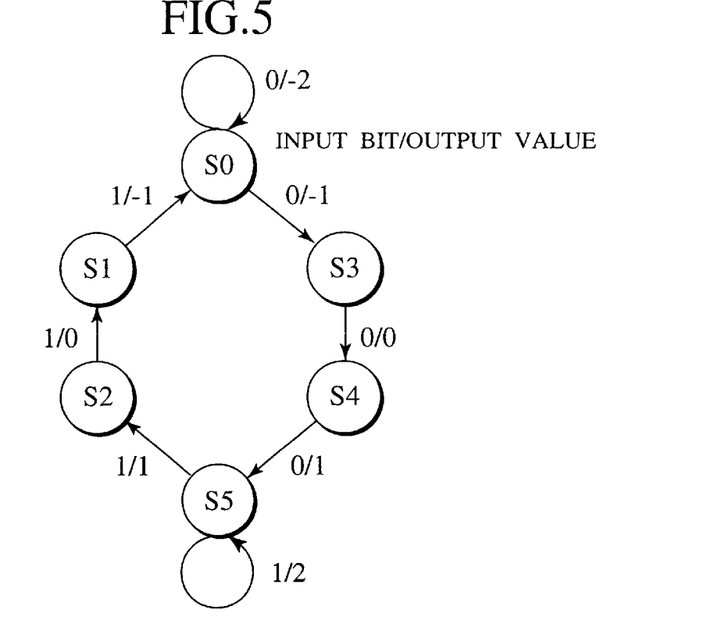
FIG. 5 is a state transition diagram of PR (1, 1, 1, 1)
Figure 6:
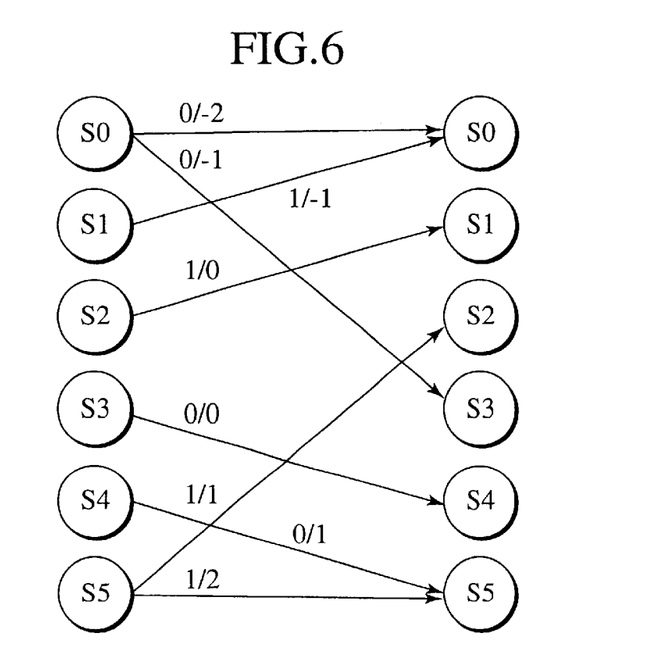
FIG. 6 is a decoding Trellis diagram corresponding to FIG. 5.

FIG. 5 is a state transition diagram corresponding to FIG. 4. In the same diagram, S0, S1, S2, S3, S4, S5 indicate state of input data (decoded data). A left value of a symbol attached to each arrow between the states indicates input bit (1 bit of input bit) and a right value indicates an output value. FIG. 6 indicates a decoding Trellis of PR (1, 1, 1, 1) corresponding to the state transition diagram of FIG. 5. Like FIG. 5, a left value of a symbol attached to each arrow between the states indicates a value of a bit of input data while a right value indicates an output value.

The Viterbi decoder shown in FIG. 3 is a circuit for conducting Viterbi decoding using the PR (1, 1, 1, 1). The branch metric operating circuit 11 contained therein receives a waveform sampled from reproduced waveforms subjected to waveform equalization indicated by the state transition diagram of FIG. 5 at a bit cycle interval as input data $y_{(k)}$ through the terminal 10 and further, receives five target values TU, MU, ZE, ML, TL from the target value computing circuit 15 described later, then carries out branchmetric computation and outputs two selection signals 0, 1. A feature of this embodiment is that the target value varies based on a target value error signal although it is conventionally a fixed value.

Figure 7:
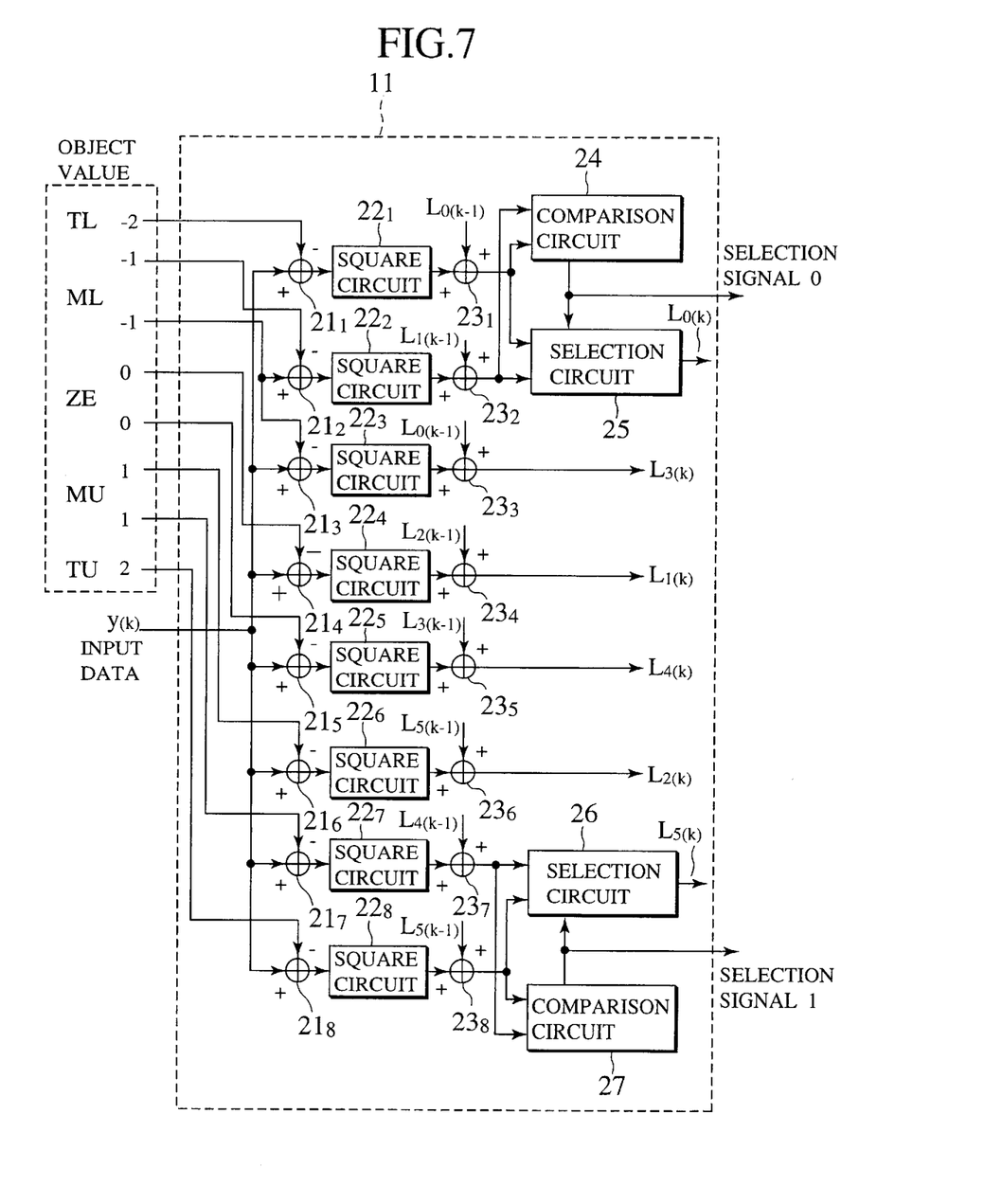
FIG. 7 is a circuit system diagram showing an example of a branchmetric operating circuit in FIG. 3.

FIG. 7 shows a circuit system diagram as an example of the branchmetric operating circuit 11. In the same diagram, the target values TU, MU, ZE, ML, TL correspond to averages of five values "2", "1", "0", "−1", "−2" indicated in the decoding Trellis of FIG. 6. A subtracter $21_1$ subtracts the target value TL from the input data $y_{(k)}$. Subtracters $21_2$, $21_3$ subtract the target value ML from the input data $y_{(k)}$. Subtracters $21_4$, $21_5$ subtract the target value ZE from the input data $y_{(k)}$. Subtracters $21_6$, $21_7$ subtract the target value MU from the input data $y_{(k)}$. A subtracter $21_8$ subtracts the target value TU from the input data $y_{(k)}$.

A differential value (error signal) relative to the target value corresponding to the input data $y_{(k)}$ extracted from each of the subtracters $21_1$–$21_8$ is squared in square circuits $22_1$–$22_8$ provided correspondingly and then supplied to each of adders $23_1$–$23_8$ where each metric of $L_{0(k-1)}$, $L_{1(k-1)}$, $L_{2(k-1)}$, $L_{3(k-1)}$, $L_{4(k-1)}$, $L_{5(k-1)}$ at time k−1 in each of the states S0, S1, S2, S3, S4, S5 is added. That is, the adders $23_1$, $23_3$, add metric $L_{0(k-1)}$ to output signals from the square circuits $22_1$, $22_3$. The adder $23_2$ adds metric $L_{1(k-1)}$ to output signal from the square circuit $22_2$. The adders $23_4$, $23_5$, $23_7$ add metrics $L_{2(k-1)}$, $L_{3(k-1)}$, $L_{4(k-1)}$ to output signals from the square circuits $22_4$, $22_5$, $22_7$. The adders $23_6$, $23_8$ add metric $L_{5(k-1)}$ to output signals from the square circuits $22_6$, $22_8$.

A comparison circuit 24 compares levels of both output signals from the adders $23_1$, $23_2$. If the output signal from the adder $23_1$ is smaller than the output signal from the adder $23_2$, a selection circuit 25 allows selective output of the output signal from the adder $23_1$ as a metric $L_0$ at time k in the state S0. In a converse case, the selection circuit 25 allows output of the output signal from the adder $23_2$ as metric $L_{0(k)}$. Meanwhile, time k indicates any time later by 1 bit cycle T relative to time k−1.

On the other hand, a comparison circuit 27 compares both output signals from the adders $23_7$, $23_8$. If the output signal from the adder $23_7$ is smaller than the output signal from the adder $23_8$, a selection circuit 26 allows selective output of the output signal from the adder $23_7$ as metric $L_{5(k)}$ at time k in the state S5. In a converse case, the selection circuit 26 allows output of the output signal from the adder $23_8$ as metric $L_{5(k)}$.

Further, metrics $L_{3(k)}$, $L_{1(k)}$, $L_{4(k)}$, and $L_{2(k)}$ at time k in states S3, S1, S4 and S2 are extracted from the adders $23_3$, $23_4$, $23_5$ and $23_6$. A selection signal 0 and a selection signal 1 are extracted from the comparison circuits 24, 27 respectively. These selection signals indicate which signal is selected in the selection circuits 25, 26.

Consequently, the metrics $L_{0(k)}$, $L_{1(k)}$, $L_{2(k)}$, $L_{3(k)}$, $L_{4(k)}$, $L_{5(k)}$ at time k in the states S0, S1, S2, S3, S4, S5 outputted from the aforementioned branchmetric operating circuit 11 are expressed by following equations.

$$L_{0(k)} = \min[\{L_{0(k-1)} + (y_{(k)} - (-2))^2\}, \{L_{1(k-1)} + (y_{(k)} - (-1))^2\}]$$

$$L_{1(k)} = L_{2(k-1)} + (y_{(k)} - (0))^2$$

$$L_{2(k)} = L_{5(k-1)} + (y_{(k)} - (1))^2$$

$$L_{3(k)} = L_{0(k-1)} + (y_{(k)} - (-1))^2$$

$$L_{4(k)} = L_{3(k-1)} + (y_{(k)} - (0))^2$$

$$L_{5(k)} = \min[\{L_{5(k-1)} + (y_{(k)} - (2))^2\}, \{L_{4(k-1)} + (y_{(k)} - (1))^2\}]$$

where min[a, b] is an operator for outputting a smaller one of a, b.

The selection signals 0, 1 extracted from the branchmetric operating circuit 11 having such a structure is supplied to the path memory 12 as shown in FIG. 3. In the branchmetric operating circuit 11 and the path memory 12, Viterbi decoding is conducted to generate decoded data series. As shown in the block diagram of FIG. 8, the path memory 12 comprises n selectors $31_1$–$31_n$ for selecting one of two input signals according to the selection signal 0, selectors $32_1$–$32_n$ for selecting one of two input signals according to the selection signal 1, delay elements $33_1$–$33_6$, $34_1$–$34_6$, $35_1$–$35_6$ each having a delay time of the bit cycle T and a majority circuit 36.

Figure 8:
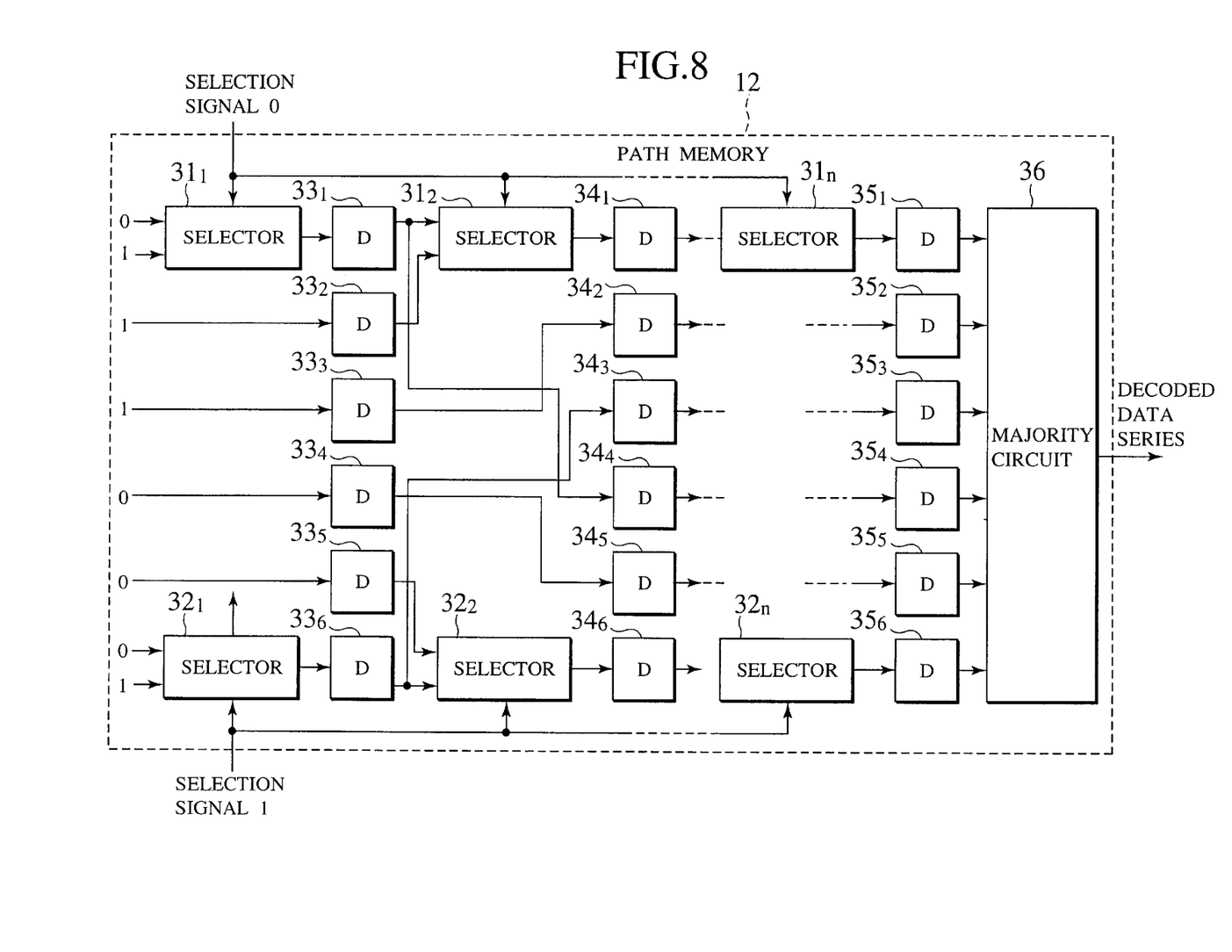
FIG. 8 is a block diagram as an example of a path memory in FIG. 3.

Respective bit values of 0, 1 to be inputted to the selector $31_1$, 1 to be inputted to the delay elements $33_2$, $33_3$, 0 to be inputted to the delay elements $33_4$, $33_5$ and 0, 1 to be inputted to the selector $32_1$ are extracted finally from the majority circuit 36 as a single decoded data series by decoding of the path memory 12. Each bit value described above corresponds to each decoding Trellis value shown in FIG. 6.

In this path memory 12, if $L_{0(k-1)} + (y_{(k)} - (-2))^2$ is outputted as $L_{0(k)}$ by the aforementioned metric operation, the selector $31_1$ selects bit value 0 according to the selection signal 0. If $L_{1(k-1)} + (y_{(k)} - (-1))^2$ is outputted, the bit value 1 is selected according to the selection signal 0. On the other hand, if $L_{5(k-1)} + (y_{(k)} - (2))^2$ is outputted as $L_{5(k)}$ by the aforementioned metric operation, the bit value 1 is selected by the selection signal 1. If $L_{4(k-1)} + (y_{(k)} - (1))^2$ is outputted, the bit value 0 is outputted. The other selectors perform the same selection operation based on the selection signal and conducts Viterbi decoding based on the decoding Trellis shown in FIG. 6.

The number of the selectors $31_1$–$31_n$, $32_1$–$32_n$, delay elements $33_1$–$33_6$, $34_1$–$34_6$, $35_1$–$35_6$ and the like are determined depending on the decoding performance. Usually, the number are determined so that the aforementioned n value is about 32.

The decoded data series extracted from the path memory 12 in this way is outputted from an output terminal 16 shown in FIG. 3 and supplied to the data estimating circuit 14. The data estimating circuit 14 outputs estimation data $Y_{(k-i)}$ earlier by time i than k to the target value computing circuit 15 depending on the length of the path memory 12.

Figure 9:
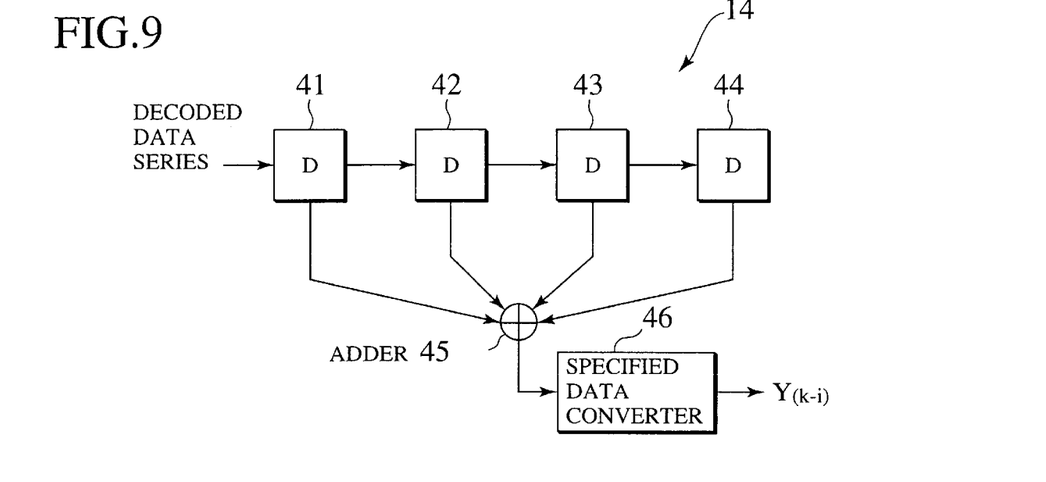
FIG. 9 is a block diagram as an example of a data estimating circuit in FIG. 3.

FIG. 9 shows a block diagram as an example of the data estimating circuit 14. As shown in the same diagram, the data estimating circuit 14 comprises delay elements 41, 42, 43, 44 connected longitudinally through four stages driven by clock based on the bit cycle T under PR (1, 1, 1, 1), an adder 45 for summing up delay signals from the delay elements 41–44 so as to produce a synthetic signal and an estimation data converter 46 which receives the synthetic signal from the adder 45 as an input and outputs estimation data $Y_{(k-1)}$.

An operation of this data estimating circuit 14 will be described. The decoded data series outputted in the formation of bit string (binary string) are delayed successively by the bit cycle T by the delay elements 41–44 and then, respective output delay signals from the delay elements 41–44 are summed up by the adder 45 so as to produce a synthetic signal. This synthetic signal is supplied to the estimation data converter 46. The estimation data converter 46 converts an output value of the adder 45 and outputs one of the target values TU, MU, ZE, ML, TL shown in FIG. 7 as estimation data $Y_{(k-1)}$.

Data conversion by the estimation data converter 46 is carried out according to the following rule. That is, when all respective output signals of the delay elements 41–44 are "0", namely (0000), the value of output synthetic signal from the adder 45 is "0" and at this time, the estimation data converter 46 outputs the target value TL as estimation data $Y_{(k-1)}$. If of the respective output signals from the delay elements 41–44, the output signal from the delay element 41 or 44 is "1" while the remaining three output signals are "0", namely (1000 or 0001), the value of output synthetic signal from the adder 45 is "1" and at this time, the estimation data converter 46 outputs the target value ML as estimation data $Y_{(k-1)}$.

If of respective output signals from the delay elements 41–44, the output signals from the delay elements 41 and 42 or the output signals from the delay elements 43 and 44 are "1" while the remaining two output signals are "0", namely (1100 or 0011), the value of output synthetic signal from the adder 45 is "2" and at this time, the estimation data converter 46 outputs the target value ZE as estimation data $Y_{(k-1)}$. Further, if of respective output signals from the delay elements 41–44, the output signal from the delay element 41 or 44 is "0" while the remaining three output signals are "1", namely (1110 or 0111), the value of output synthetic signal from the adder 45 is "3" and at this time, the estimation data converter 46 outputs the target value MU as estimation data $Y_{(k-1)}$. If all respective output signals from the delay elements 41–44 are "1", namely (1111), the value of output synthetic signal from the adder 45 is "4" and at this time, the estimation data converter 46 outputs the target value TU as estimation data $Y_{(k-1)}$. The above described matters are summarized as follows in Table 1.

TABLE 1

| DELAY ELEMENT OUTPUT | ADDER OUTPUT | ESTIMATION DATA $Y_{(K-1)}$ |
|---|---|---|
| 0000 | 0 | TL |
| 0001, 1000 | 1 | ML |
| 0011, 1100 | 2 | ZE |
| 0111, 1110 | 3 | MU |
| 1111 | 4 | TU |

When four 0s are continuous as decoded data series, the data estimating circuit 14 estimates data earlier by time i than the time k to be the target value TL (corresponding to a conventional target value −2). Likewise, if one 1 exists like 0001, 1000, it is estimated to be the target value ML (corresponding to a conventional target value −1) and if two is exist like 1100, 0011, it is estimated to be the target value ZE (corresponding to a conventional target value 0) and outputted as estimation data $Y_{(k-1)}$. Because the output of the Viterbi decoder has a low rate in bit error, a very accurate estimation data can be obtained.

The aforementioned estimation data $Y_{(k-i)}$ outputted from the data estimating circuit 14 is supplied to the target value computing circuit 15 as shown in FIG. 3. Input data $y_{(k)}$ to the branchmetric operating circuit 11 is delayed up to the same time as the estimation data $Y_{(i-1)}$ outputted from the data estimating circuit 14 by the delay circuit 13, which is determined by the length of the path memory 12, and then delayed input data $y_{(k-i)}$ is inputted to the target value computing circuit 15.

Figure 10:
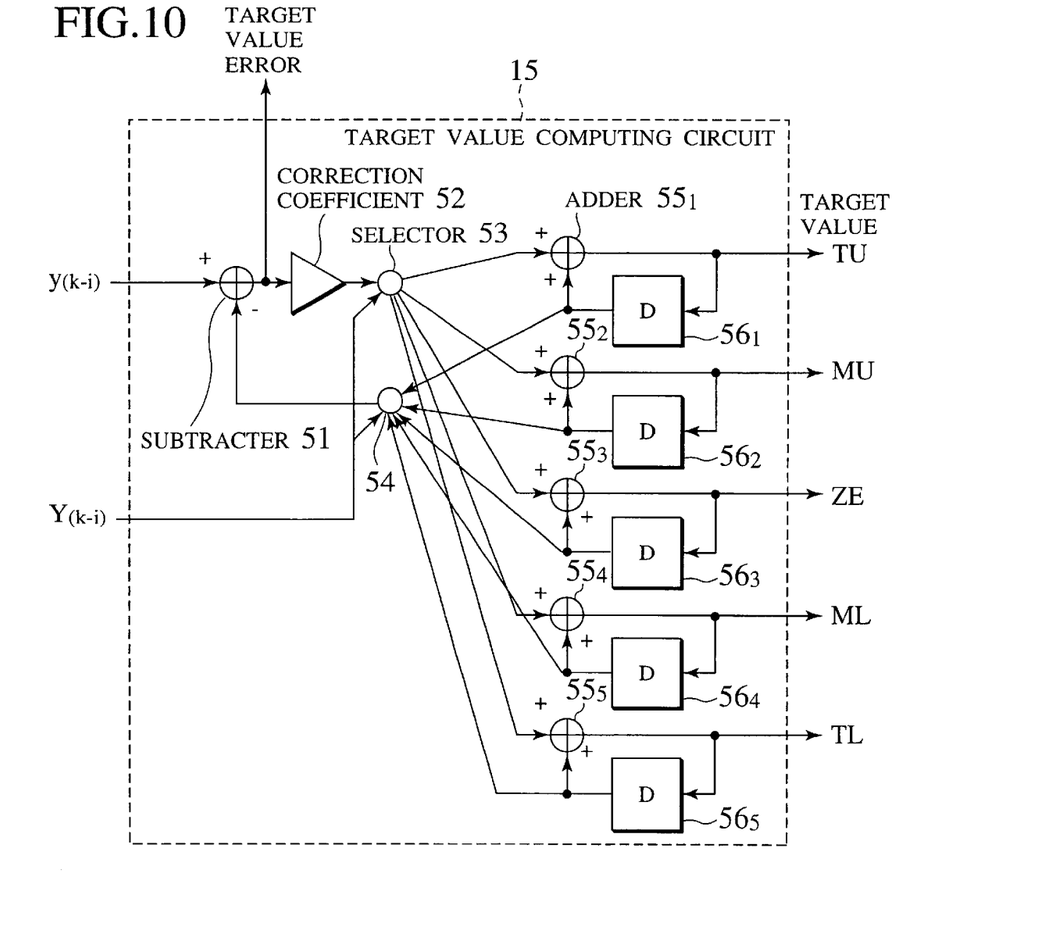
FIG. 10 is a circuit system diagram showing an example of a target value computing circuit in FIG. 3.

The target value computing circuit 15 updates the target value based on these input data $Y_{(k-i)}$, $y_{(k-i)}$ and outputs results to the branchmetric operating circuit 11. FIG. 10 shows a circuit system diagram as an example of the target value computing circuit 15. As shown in the same diagram, the target value computing circuit 15 comprises a subtracter 51 for operation for error, a multiplier 52 for multiplying with a correction coefficient, selectors 53, 54 which conduct selective operations according to the estimation data $Y_{(k-i)}$, adders $55_1$–$55_5$, and delay elements $56_1$–$56_5$ which compose a feedback group and are independent of one another.

Then, an operation of the target value computing circuit 15 will be described. The delayed input data $y_{(k-i)}$ extracted from the delay circuit 13 is supplied to the subtracter 51, where a delay element output signal from any one of the delay elements $56_1$–$56_5$ selected by the selector 54 based on the estimation data $Y_{(k-i)}$ is subtracted from this delayed input data $y_{(k-i)}$ so as to produce a target value error signal. After that, that target value error signal is multiplied with the correction coefficient G by the multiplier 52 and its result is supplied to the selector 53 and then, selectively inputted to any one of the adders $55_1$–$55_5$ depending on the estimation data $Y_{(k-i)}$.

If the target value TL, for example, is estimated as the estimation data $Y_{(k-i)}$, the selector 54 selects a target value $TL_{(k-1)}$ earlier by 1 bit cycle T extracted from the delay element $56_5$. Thus, the target value error signal expressed by $[y_{(k-i)}-TL_{(k-1)}]$ is extracted from the subtracter 51 and multiplied with the correction coefficient G by the multiplier 52 so as to produce a signal expressed by $[G(y_{(k-i)}-TL_{(k-1)})]$. After that, this signal is selectively inputted to the adder $55_5$ by the selector 53 where a target value $TL_{(k-1)}$ extracted from the delay element $56_5$ is added to this value. Consequently, a corrected target value $TL_{(k)}$ expressed by the equation $TL_{(k)}=TL_{(k-1)}+G(y_{(k-i)}-TL_{(k-1)})$ is extracted from the adder $55_5$ and outputted to the branchmetric operating circuit 11.

The same thing occurs if the other target value is estimated as the estimation data $Y_{(k-i)}$. If the target value TU is estimated, the selector 53 outputs an input signal to the adder $55_1$ and the selector 54 selects an output signal from the delay element $56_1$. If the target value MU is estimated, the selector 53 outputs an input signal to the adder $55_2$ and then, the selector 54 selects an output signal from the delay element $56_2$. If the target value ZE is estimated, the selector 53 outputs an input signal to the adder $55_3$ and the selector 54 selects an output signal from the delay element $56_3$. If the target value ML is estimated, the selector 53 outputs an input signal to the adder $55_4$ and the selector 54 selects an output signal from the delay element $56_4$.

An initial target value is inputted to the target value computing circuit 15 and maintained by the delay elements $56_1$–$56_5$. When operation starts or error operation caused by a long non-signal state, for example, is not converged yet, an initial target value selection signal is inputted from, for example, system controller (not shown) or non-signal detection circuit and the initial target value is used as the target value.

Five updated target values, which is extracted from the target value computing circuit 15 and supplied to the branchmetric operating circuit 11 in this way, approach five averages having the highest incidence (having a peak in histogram) in data inputted to the Viterbi decoder, so that excellent Viterbi decoding is enabled. That is, according to this embodiment, an improvement of the decoding performance for some extent of non-linear distortion can be expected by correcting the target values.

Next, the other embodiment of the present invention will be described. Although according to the above described embodiment, the improvement of the decoding performance for some extent of the non-linear distortion can be expected, a largely distorted waveform undergoes asymmetry in branchmetric error operation at a place having a large distortion and this may not be corrected. Thus, according to this embodiment, a circuit portion of the target value computing circuit 15 shown in FIG. 3 is constructed with a structure shown in a block diagram of FIG. 11 so as to make the target values symmetrical and control the target values for the branchmetric operating circuit 11 to operate normally against a large distortion.

Figure 11:
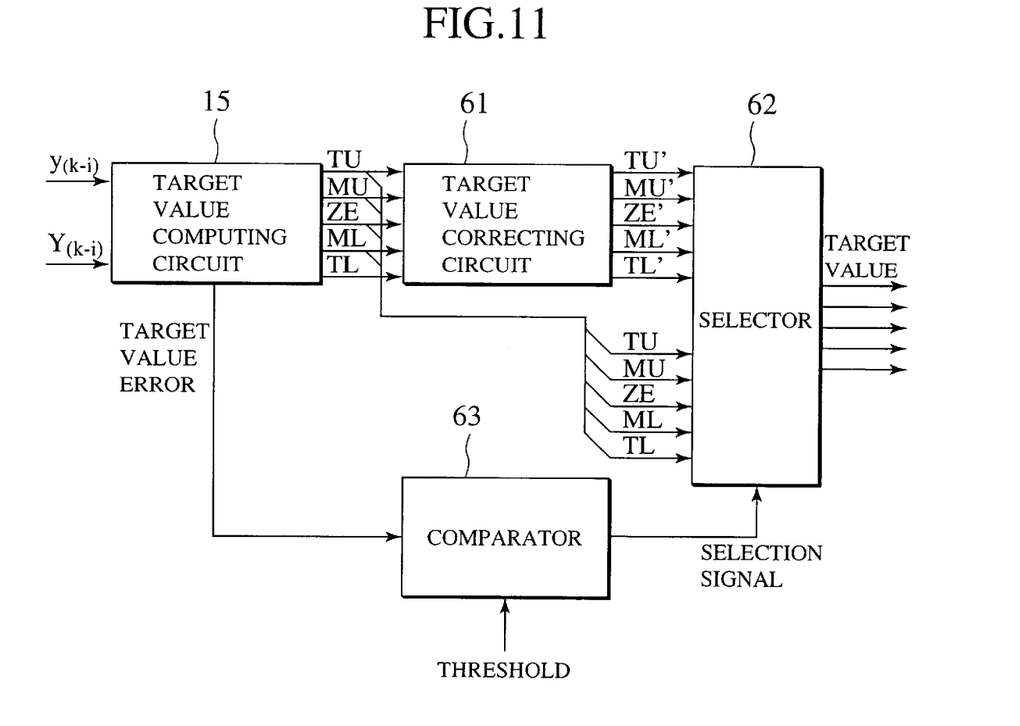
FIG. 11 is a block diagram of major components according to another embodiment of the present invention.

Referring to FIG. 11, the five updated target values extracted from the target value computing circuit 15 are supplied to a target value correcting circuit 61 and corrected and at the same time, supplied directly to a selector 62. The selector 62 selects corrected target values from the target value correcting circuit 61 or target values from the target value computing circuit 15 depending on a selection signal from a comparator 63. Output target values from the selector 62 is outputted to the branchmetric operating circuit 11 shown in FIG. 3.

The target value correcting circuit 61 generates corrected target values TU', MU', ZE', ML', TL' corresponding to the five target values TU, MU, ZE, ML, TL from the target value computing circuit 15 such that respective target values are symmetrical with respect to the target value ZE which is a median of the five target values TU, MU, ZE, ML, TL. More specifically, this circuit generates and outputs the corrected target values TU', MU', ZE', ML', TL' according to the following equation using the five updated target values TU, MU, ZE, ML, TL.

$$TU'=-TL'=(TU-TL)/2$$
$$ML'=-ML'=(MU-ML)/2$$
$$ZE'=ZE$$

That is, the corrected target values TU', TL' are average between the target values TU and TL. The corrected target values MU', ML' are average between the target values MU and ML. Meanwhile, needless to say, the target value correcting circuit 61 may generate the corrected target value based on a more complicated formula.

The comparator 63 compares a target value error extracted from the subtracter 51 shown in FIG. 10 in the target value computing circuit 15 with a threshold set preliminarily from outside. If the target value error is less than the threshold, the selector 62 is made to select target values from the target value computing circuit 15. If the target value error exceeds the threshold, the selector 62 is made to select corrected target values from the target value correcting circuit 61. Because the target value error corresponds to a waveform distortion of the input data $y_{(k)}$ in the Viterbi decoder, if the waveform distortion is so large that it exceeds a certain set value, the target values are made symmetrical by exchanging the target values to be supplied to the branchmetric operating circuit 11 with the corrected target values from the target value correcting circuit 61, so as to operate the branchmetric operating circuit 11 normally against a large distortion.

In the meantime, the present invention is not restricted to the above described embodiments. For instance, it is permissible to use a value multiplied with a coefficient as the target value error or a signal subjected to integration. Further, the initial target values may be used as the target values selected by the selector 62.

As described above, according to the present invention, the branchmetric operation is conducted based on plural first target values near plural averages each having the highest incidence (having a peak in histogram). As a result, an accurate Viterbi decoding having a smaller error rate than conventionally can be carried out for even input data having non-linear distortion.

Further, according to the present invention, when operation starts or error operation is not converged yet, the branchmetric operation is carried out based on plural initial target values. Thus, a stable Viterbi decoding can be carried out even when the operation starts or the error operation is not converged yet.

Further according to the present invention, if an equalized waveform (input data) inputted to the Viterbi decoder is largely distorted, the branchmetric operation can be conducted so as to minimize an influence of the input data distortion based on the corrected target values corresponding to plural first target values such that respective target values are symmetrical with respect to a target value which is a median of the plural first target values. Thus, an accurate Viterbi decoding can be conducted against even a largely distorted input data without generating asymmetry in the branchmetric error operation.

It should be understood that many modifications and adaptations of the invention will become apparent to those skilled in the art and it is intended to encompass such obvious modifications and changes in the scope of the claims appended hereto.

What is claimed is:

1. A Viterbi decoder comprising:

a branchmetric operating circuit for conducting branchmetric operation for input data using plural target values which are reference values for the branchmetric operation so as to generate a selection signal;

a path memory for outputting decoded data series produced by Viterbi-decoding said input data based on said selection signal outputted from said branchmetric operating circuit;

a data estimating circuit for outputting estimation data estimating an input data at a time earlier by a predetermined bit cycle than said input data based on said decoded data series outputted from said path memory; and a target value computing means for correcting the target values with a difference between said estimation data outputted from said data estimating circuit and said input data, as a target value error, and outputting obtained plural first target values to said branchmetric operating circuit as said plural target values.

2. A Viterbi decoder according to claim 1 wherein said target value computing means holds plural initial target values preliminarily and when operation starts or error operation is not converged yet, outputs said plural initial target values to said branchmetric operating circuit as said plural target values.

3. A Viterbi decoder according to claim 1 wherein said target value computing means comprises:

a target value computing circuit for generating said plural first target values with a difference between said estimation data outputted from said data estimating circuit and said input data as a target value error;

a target value correcting circuit for generating plural second target values as corrected target values corresponding respectively to said plural first target values so that respective target values are symmetrical with respect to a target value which is a median of said plural first target values; and a selecting means for if said target value error obtained by said target value computing circuit is equal to or less than a predetermined threshold, outputting said plural first target values to said branchmetric operation circuit and if said target value error exceeds said threshold, outputting said plural second target values to said branchmetric operating circuit.

4. A Viterbi decoding method comprising:

a first step of generating a selection signal by conducting branchmetric operation for input data using plural target values which are reference values for the branchmetric operation;

a second step of outputting decoded data series produced by Viterbi-decoding said input data based on said selection signal;

a third step of outputting estimation data estimating input data at a time earlier by a predetermined bit cycle than said input data based on said decoded data series; and a fourth step of correcting the target values with a difference between said estimation data and said input data, as a target value error, and using obtained plural corrected target values as said plural target values.

\* \* \* \* \*